United States Patent [19]

Kumagai et al.

[11] Patent Number: 5,477,077

[45] Date of Patent: Dec. 19, 1995

[54] SEMICONDUCTOR DEVICE AND A METHOD FOR THE MANUFACTURE THEREOF

[75] Inventors: Naoki Kumagai; Katsunori Ueno, both of Matsumoto, Japan

[73] Assignee: Fuji Electric Co., Ltd., Japan

[21] Appl. No.: 45,078

[22] Filed: Apr. 12, 1993

[30] Foreign Application Priority Data

Apr. 17, 1992 [JP] Japan ................................. 4-097578
Jul. 8, 1992 [JP] Japan ................................. 4-181114

[51] Int. Cl.⁶ .......................... H01L 27/01; H01L 29/48
[52] U.S. Cl. .......................... 257/487; 257/212; 257/342; 257/476
[58] Field of Search .......................... 257/341, 342, 257/487, 476, 212–214

[56] References Cited

U.S. PATENT DOCUMENTS

| | | | |
|---|---|---|---|
| 3,872,491 | 3/1975 | Hanson et al. | 257/365 |
| 4,521,795 | 6/1985 | Coe et al. | 257/341 |
| 4,642,674 | 2/1987 | Schoofs | 257/341 |
| 4,831,423 | 5/1989 | Shannon | 257/378 |
| 5,001,535 | 3/1991 | Nishizawa et al. | 257/212 |

*Primary Examiner*—J. Carroll
*Attorney, Agent, or Firm*—Parkhurst, Wendel & Rossi

[57] ABSTRACT

In diodes used with high withstand voltages, the pin-type diode has a low on-resistance, but a large switching loss. Even if a lifetime killer is introduced, the low on-resistance and the switching loss cannot be compatible since both factors are in a trade-off relation. The invention overcomes these problems by providing a semiconductor device that includes $p^+$-type anode layers and $p^+$-type floating drain layers that are connected to the anode layers by a MOSFET 20 formed on the surface of an $n^-$-type conductivity-modulating layer. When a forward voltage is applied, holes are injected from the drain layers to create an element with a conductivity-modulated condition and realize a low on-resistance. By the time a reverse voltage is applied, the drain layers have already been separated to reduce the number of excessive carriers. Thus, the reverse recovery current is suppressed.

9 Claims, 5 Drawing Sheets

SEMICONDUCTOR DEVICE AND A METHOD FOR THE MANUFACTURE THEREOF

FIELD OF THE INVENTION

The present invention relates to the structure of a diode used in power converters, and more particularly to the structure of a rectifier that can be applied to high withstand voltage.

BACKGROUND OF THE INVENTION

A diode used in power converters must have a low on-state voltage and high switching speed. At a low voltage application, a Schottky diode is generally used because it offers these characteristics. However, if a Schottky diode is designed for a high voltage application, the on-voltage increases a lot, and the loss resulting from the leakage current increases. Therefore, a PIN-type diode is usually used for high voltage application. This PIN-type diode has a so-called conductivity-modulating layer, and can be used under a high voltage, thereby reducing the on-voltage. However, a large reverse recovery current flows with a reverse recovery because of excessive carriers in the conductivity-modulating layer. FIG. 8 shows the changes that take place in the current during reverse recovery in the PIN-type diode. When a current is decreased at a time t1 with certain di/dt, the voltage decreases as the current decreases. When a reverse voltage is applied, the carriers injected into the conductivity-modulating layer are swept out, and a large reverse recovery current begins to flow. Therefore, when high-speed switching is performed by using the PIN-type diode, a problem arises in that the switching loss increases.

To reduce the reverse recovery current in the PIN-type diode, a lifetime killer (i.e., a recombination center) may be introduced to quickly recombine the excessive carriers during reverse recovery. However, introducing a lifetime killer to accelerate carrier recombination creates a problem in that it reduces the carriers and raises the on-state voltage as a result of the recombination even if the PIN-type diode is in an on-state. Thus, in the PIN-type diode, the on-state voltage reduction is in a trade-off relation with the switching loss.

To solve this problem, a proposal has been made for a diode which suppresses this increase in leakage current, a problem that exists in the Schottky diode, which is constructed as shown in FIG. 9. This diode has an $n^-$-type semiconductor layer 2 formed on an $n^+$-type semiconductor substrate 1, on which a $p^+$-type anode layers 3 are formed in a dispersed manner. Further-more, a cathode electrode 9 is connected to the $n^+$-type semiconductor substrate 1, and an anode electrode 8 is connected across from the $n^-$-type semiconductor layer 2 to the $p^+$-type anode layers 3. This anode electrode 8 is selected so that it makes a Schottky junction with the $n^-$-type semiconductor layer 2 and an ohmic junction with the $p^+$-type anode layers 3. Therefore, when a voltage in the reverse direction is applied to the anode electrode 8 and the cathode electrode 9, the anode electrode 8 is isolated electrically from the cathode electrode 9 as a result of the Schottky junction and the p-n junction. The space between each anode layer 3 is determined in a way that the depletion layers 11 spreading from the anode layers 3 are pinched off the surface of the $n^-$-type semiconductor layer 2. Therefore, the region in which the anode electrode 8 is connected with the $n^-$-type semiconductor layer 2 has the depletion layers 11 spread, whereas a leakage current from the Schottky junction under a state in which a reverse recovery voltage is applied is suppressed. Thus, this diode is a diode that offers high-speed performance of the Schottky diode and a lower leakage current. However, because the $n^-$-type semiconductor layer 2 does not enter a conductivity-modulating condition, this type of device with high withstand voltage has high on-state voltage.

In order to reduce the on-state voltage in such a diode, a diode, which has a structure as shown in FIG. 10, is proposed. This diode has the same basic structure as the diode shown in FIG. 9, except the width of the anode layers 3 is increased. Such an element is commonly called a spin diode, and has a high-speed performance of the Schottky diode in a region with less current, developing the conductivity modulation in a region with a larger current, and its behavior resembles a pin-type diode. That is, when a forward voltage is applied and a large current flows into the cathode electrode 9 from the junction of the $n^-$-type semiconductor layer 2, a voltage drop is generated because the electron current components flow transversely directly below the $p^+$-type anode layers 3. In this diode, since the width of the anode layer 3 is great, the junction of the $p^+$-type anode layers 3 and the $n^-$-type semiconductor layer 2 is biased in the forward direction. Therefore, holes are injected from the $p^+$-type anode layers 3 into the $n^-$-type semiconductor layer 2 to develop a conductivity modulation.

Thus, in the diode shown in FIG. 10, the on-state voltage can be reduced because the $n^-$-type semiconductor layer 2 performs the conductivity modulation. However, its on-voltage reducing effect is only slight because its injection efficiency is not as high and the conductivity modulation is not as great as it is in the pin-type diode. Nevertheless, a conductivity modulation, which is not as large, reduces the excessive carrier amount, and can recover at a relatively high speed. Therefore, characteristically it leads to behavior that is intermediate between a Schottky diode and a pin-type diode. As the anode layer 3 width is increased, the diode shows characteristics that more closely resemble those of the pin-type diode. However, it is not possible to realize diodes that have superior characteristics possessed by Schottky diodes and pin-type diodes, that is, combining a low on-state voltage and high-speed performance.

It is of course possible to achieve a higher speed by introducing a lifetime killer into these diodes, but since the trade-off relation between the on-state voltage and switching loss is for an improvement, no low on-state voltage and low switching loss can be realized.

Accordingly, in the light of the above problems, the present invention is intended to realize a diode element that can simultaneously realize a low on-state voltage and a low switching loss.

SUMMARY OF THE INVENTION

In order to solve the above problems, according to the present invention, a low on-state voltage and low switching loss can be switched in a realizable condition, using diffusion layers in a floating condition, being the separated diffusion layers. The semiconductor device according to the present invention is characterized in that it has, on the surface of a conductivity-modulating region of the second conduction type with a low concentration, electrically opposed to a cathode region of the second conduction type with a high concentration to which a cathode electrode is connected, an anode electrode Schottky-junctioned in the conductivity-modulating region and a Schottky junction region, and at least one anode layer of the first conduction type to which the anode electrode is ohmically connected, wherein the semiconductor device has a floating region of the first conduction type connected to the anode electrode via a MISFET.

It is desirable that an anode region have two or more adjacent anode layers spanning the area of the Schottky junction region, that the MISFET be a first conduction-type MISFET which is connected at least one of the anode layers, and the floating region by using gate electrodes formed on the conductivity-modulating region (first conduction-type high resistivity is more desirable) via gate oxide films, and it is also effective to form a channel region of the first conduction type on the conductivity-modulating region surface below the gate oxide films.

It is possible that the MISFET is a second conduction-type MISFET, which is constructed in a well region of the first conduction type formed on the surface of the conductivity-modulating region in the vicinity of the anode region. It is effective that the anode electrode is ohmically connected with the well region.

Furthermore, it is also effective that the MISFET is a second conduction-type MISFET which is formed in the well region of a first conduction type formed on a surface of the conductivity-modulating regions in the vicinity of the anode region, wherein the connecting electrodes connected with the floating region are ohmically connected with the well region. In this case, it is desirable that the anode region have two or more adjacent anode layers spanning the area of the Schottky junction region.

On the other hand, with the same structure, it is also effective that the anode electrode is not Schottky-junctioned, but that the connecting electrodes connecting this MISFET with the floating region form a Schottky region which is Schottky-junctioned with the conductivity-modulating region around the floating region connected to the MISFET of the second conduction type.

In addition, the semiconductor device can be driven by a driving method characterized in that the semiconductor device has, on a surface of the conductivity-modulating region of the second conduction type and with a low concentration, electrically opposed to a cathode region of the second conduction type with a high concentration to which a cathode electrode is connected, an anode electrode Schottky-junctioned in the conductivity-modulating region and the Schottky region, and an anode region of the first conduction type to which the anode electrode is ohmically connected, and a floating region of a first conduction type connected to the anode electrode via the MISFET, wherein the method has a process to apply a forward voltage to the cathode electrode and the anode electrode while applying a conduction voltage to the MISFET, and it also has an inverse recovery process to apply a reverse voltage to the cathode electrode and the anode electrode after applying an interruption voltage to the MISFET.

In the semiconductor device, which is constructed as described above, when the conduction voltage is applied to the MISFET in an on-state in which a forward voltage is applied to the cathode electrode and the anode electrode, the anode electrode is conducted with the floating region. Through this operation, a voltage difference is created that can give a sufficient forward bias to the PN junction between the voltage drop due to a current flowing from the anode electrode to the cathode region in the conductivity-modulating region and the floating region. Therefore, a large number of minority carriers are injected into the conductivity-modulating region from the anode electrode via the floating region, thereby producing a conductivity-modulated condition. For this reason, the on-resistance in this semiconductor device is reduced.

On the other hand, when an interruption voltage is applied to the MISFET immediately before a reverse voltage is applied to this semiconductor device, the supply of majority carriers from the anode electrode to the floating region stops, as does the injection of minority carriers from the floating region to the conductivity-modulating region. As a result, the carrier density in the conductivity-modulating region decreases. When a reverse voltage is applied under this condition, the reverse recovery current due to sweeping out carrier is suppressed, thereby reducing the switching loss.

It is possible to construct a MISFET using the conductivity-modulating region by arranging gate electrodes over the floating region and the anode region. If the Schottky junction area is sandwiched with two or more anode layers, depletion layers will extend from the anode layers to create a pinch-off condition when a reverse voltage is applied, thus no leakage current will flow through the Schottky junction.

In addition, it is possible to control the MISFET with zero or different voltages by forming a depression region in the conductivity-modulating layer directly below the gate electrodes. Therefore, no voltage need be made available for both the positive and negative poles, which facilitates the device control.

It is also possible to form a well region of the first conduction type in the conductivity-modulating region, and to construct a MISFET of the second conduction type within the region. It is possible to control the conductivity-modulating region in the same manner as described above using the floating region connected to a MISFET of the second conduction type. Furthermore, the Schottky junction region can be pinched off by connecting the anode electrode to this well region, enabling a reduction in the leakage current.

It is also possible to junction the well region with the connecting electrodes connected to the floating region from the MISFET, so that the specific resistance in the well region to the conductivity-modulating region can be raised, thus making it possible to suppress the carrier injection when a reverse voltage is applied. In this case, suppression of the leakage current from the anode layers may be expected by sandwiching the Schottky region using two or more anode layers. Furthermore, the conductivity-modulating region can be controlled using the floating region even if the floating region is put into contact with the well region.

In addition, forming a Schottky junction region in the electrode that connects the floating region to the MISFET, rather than with the anode electrode, enables control of the conductivity-modulating region using the floating region in the same manner as described above, and therefore makes it possible to realize a semiconductor with a low on-resistance when subjected a high withstand voltage.

As described, the semiconductor device according to the present invention has a low on-resistance, as well as a low switching loss even when subjected to a high withstand voltage. This makes it possible to realize a semiconductor without leakage current.

DETAILED DESCRIPTION OF THE DRAWINGS

DETAILED DESCRIPTION OF THE PREFERRED EMBODIMENTS

The embodiments of the present invention are explained hereunder with reference to the drawings.

Figure 1:
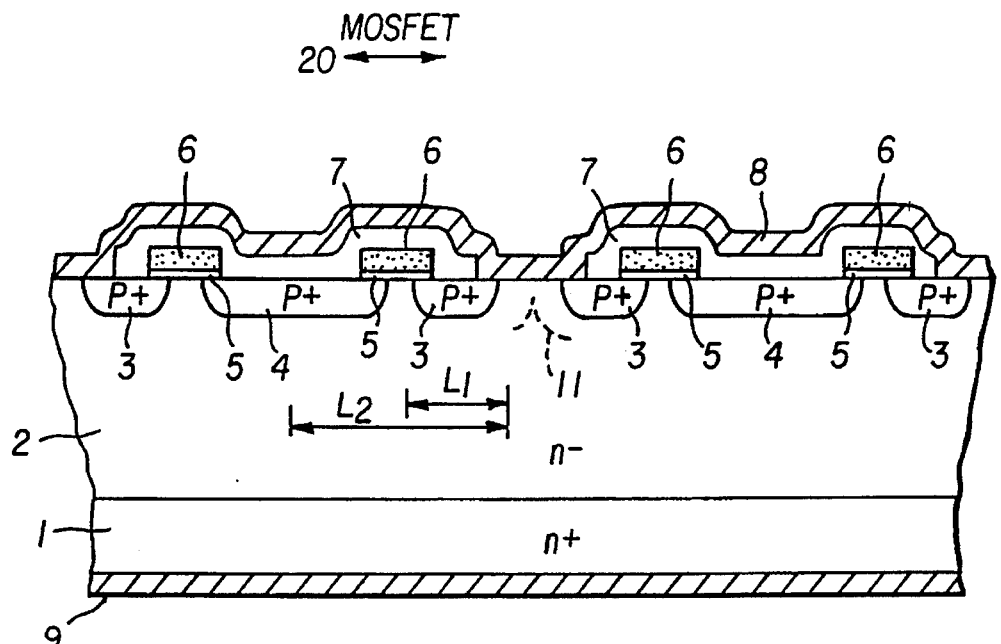
FIG. 1 is a cross section showing a configuration of the semiconductor device according to a first embodiment of the present invention.

FIG. 1 shows the structure of the semiconductor device according to a first embodiment of this invention. This rectifier has, as in the case of conventional diodes, an $n^-$-type semiconductor layer 2 formed on an $n^+$-type semiconductor substrate 1 connected with a cathode electrode 9, on which $p^+$-type anode layers 3 are formed in a dispersed manner. Furthermore, an anode electrode 8 is connected across the $n^-$-type semiconductor layer 2 to the $p^+$-type anode layers 3. This anode electrode 8 is so selected that it makes a Schottky junction with the $n^-$-type semiconductor layer 2 and an ohmic junction with the $p^+$-type anode layers 3. Another important characteristic of this device is that the surface of the conductivity-modulating layer 2 is separated by the anode electrode 8 and the inter-layer insulating film 7 between the anode layers 3. In addition, on the surface of the conductivity-modulating layer 2, $p^+$-type drain layers 4 with a wider width than that in the anode layers 3 are formed separated from the anode layers 3. Gate electrodes 6 are disposed from the edges of the drain layers 4 to the edges of the anode layers 3 via a gate-insulating film, and these anode layers 3, the drain layers 4, and the gate electrodes 6 constituting a p-channel MOSFET 20. Therefore, the drain layers 4 are in a floating condition, and they function as a floating layer controlled by the MOSFET 20.

The impurity concentrations for the anode layers 3 and the conductivity-modulating layer 2 in this device is set so that, in the lower part L1 of the anode layers 3, a hole injection from the anode layers can be disregarded in a current density range in which this device is used. The impurity concentrations for the drain layers 4 and the conductivity-modulating layer 2 and the width of the drain layers 4 are set so that a transverse electron current in a region L2 from an anode layer 3 to the center of a drain layer 4 can give a sufficient forward bias to the p-n junction between the drain layer 4 and the conductivity-modulating layer 2. Therefore, when a forward voltage is applied to the anode electrode 8 and the cathode electrode 9, and the MOSFET 20 is conductive, the p-n junction between the drain layers 4 and the conductivity-modulating layer 2 is forward-biased, whereas the holes that are the minority carriers are sufficiently injected from the drain layers 4 to the conductivity-modulating layer 2 via the anode layers 3.

Figure 2:
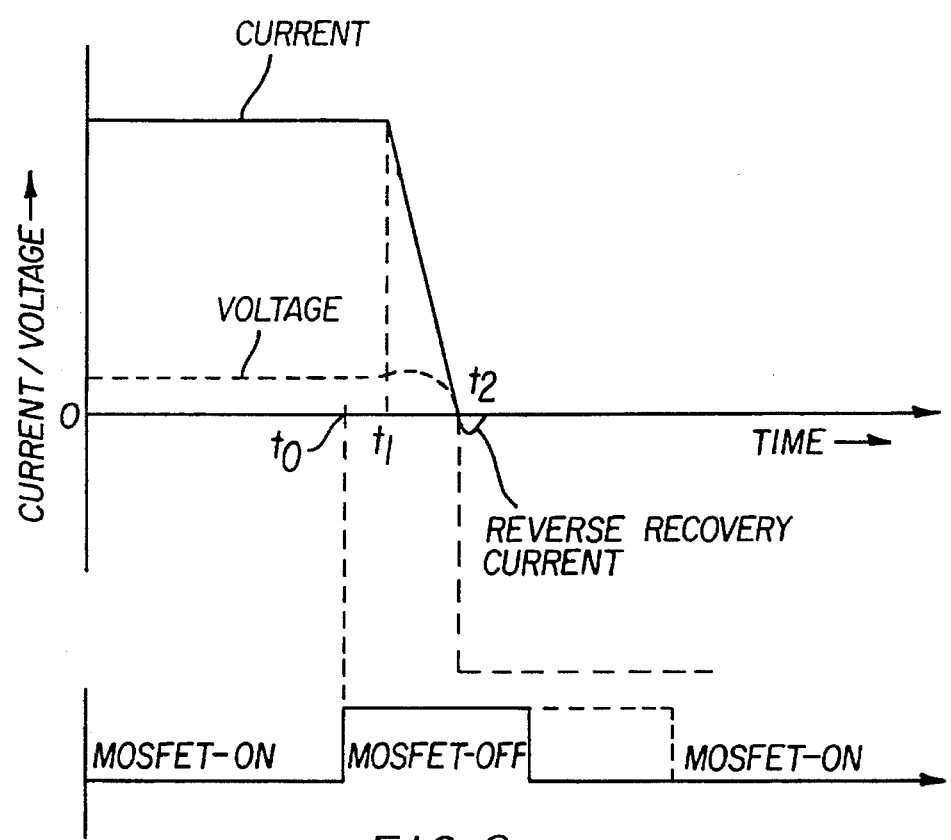
FIG. 2 is a graph showing the current-voltage characteristics of the semiconductor shown in FIG. 1.

Detailed explanations are given of the cases in which a forward voltage and a reverse voltage are applied to the device of this embodiment, with reference to the current-voltage curves shown in FIG. 2. First, a positive voltage is applied to the anode electrode 8, and a negative voltage to the cathode electrode 9, and a gate potential applied to the gate electrodes 6 is biased negatively against the anode electrode 8. This forms a p-type an inversion layer on the surface of the $n^-$-type conductivity-modulating layer 2 directly below the gate electrodes 6. Therefore, the MOSFET 20 is made conductive, and the drain layers 4 have the same potential as the anode layers 3. In addition, among the currents flowing from the anode electrode 8 into the conductivity-modulating layer 2, the transverse current flowing in the region L2 from the anode layers 3 to the drain layers 4 reduces the potential in the conductivity-modulating layer 2 directly below the drain layers 4 to a lower potential so that it is less than that in the drain layers 4, which is nearly identical to the potential in the anode layers 3. When this potential difference grows larger than the edgewise voltage (i.e, built-in voltage (potential)), between the drain layers 4 and the conductivity-modulating layer 2, holes are injected from the drain layers 4 into the conductivity-modulating layer 2. Therefore, the conductivity modulating layer 2 enters a conductivity-modulated condition, which reduces the on-resistance.

On the other hand, when applying a reverse potential, the gate potential is first made positive against the anode electrode 8 or is made identical with it at the time, "t0". This turns the MOSFET 20 off, and separates the drain layers 4 from the anode layers 3. When holes are injected into the conductivity-modulating layer 2 from the drain layers 4, the potential at the drain layers 4 decreases because of the lack of holes supplied from the anode layers 3. Moreover because the potential at the drain layers 4 becomes identical to that at the conductivity-modulating layer 2, no further hole injection takes place. This reduces the number of excessive carriers in the conductivity-modulating layer 2. When a forward current is applied to this device under the above condition at the time, "t1" the voltage, decreases. This results in that a reverse-recovery current flows upon inversion at the hour "t2". However, in the device according to this embodiment, since the excessive carrier density has already been reduced in the conductivity-modulating layer 2, the number of carriers swept out is small, and the reverse-recovery current is very low.

Furthermore, when this reverse potential is applied, the depletion layer 11 extends from the anode layers 3 to a region near Schottky junction and pinches off. Therefore, small leakage current can flow through this junction. Thus, this device prevents a leakage current, which is the drawback of the Schottky diode, and can take full advantage of the high-speed performance of a Schottky diode.

The timing for the time, "t0" preceding the time, "t1" when the reverse recovery stage beings must be set at an optimal timing determined from the lifetime of the carriers in the conductivity-modulating layer 2, and the magnitude of the conductivity modulation under a condition that holes are injected.

This means that if the MOSFET 20 is turned off too early, the excessive carrier density decreases but raises the on-state voltage. On the other hand, if the time, "t0" and the time, "t1" are set too close there is no time for the excessive carrier to be reduced. Therefore, the reverse-recovery current is not reduced sufficiently to allow the switching loss to be suppressed.

Thus, in this embodiment of the device, holes are injected from the drain layers 4 to create a conductivity-modulated condition when a forward voltage is applied, enabling the reduction of the on-resistance. After the hole injection is suppressed by separating the drain layers 4 from the anode layers 3 just before reverse recovery, and excessive carrier reduction is achieved, the reverse voltage is applied, and the reverse recovery current can be reduced. Therefore, this device can realize a diode element with a low on-resistance, and simultaneously realize a low switching loss.

Figure 3:
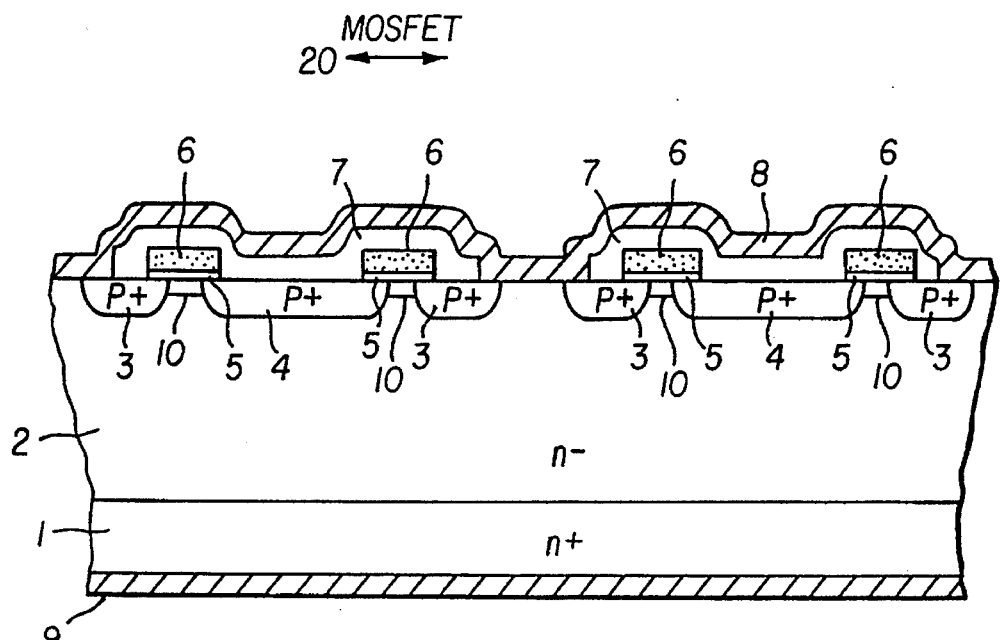
FIG. 3 is a cross section showing a configuration of the semiconductor device according to a second embodiment of the present invention.

FIG. 3 shows a structure of the semiconductor device according to a second embodiment of this invention. The construction of this semiconductor device is almost the same as that in the device described in the first embodiment, with the common parts given the same numerals, and therefore their explanations are omitted. One important characteristic of the device in this embodiment is that a p-region 10 is formed on the conductivity-modulating layer 2, which constitutes a channel for the MOSFET 20, that is, the surface of the conductivity-modulating layer 2 directly below the gate electrodes 6. This makes the MOSFET 20 in this device a depletion type MOSFET, and this MOSFET 20 is conductive when the gate voltage is biased in zero against the anode electrode 8. Therefore, in order to realize a low on-resistance when a forward voltage is applied to this device, it will suffice to make the gate electrodes 6 in the MOSFET 20 biased zero against the anode electrode 8 and it will not be necessary to apply a negative potential to the gate electrodes 6. In the case for applying a reverse voltage, a potential positive against the anode electrode 8 may be applied to the gate electrodes 6, thus the excessive carriers can be reduced while the MOSFET 20 is turned off. Therefore, with the device in this embodiment, it will suffice to simply prepare a potential positive against the anode electrode 8 to control the gate electrodes 6 and this simplifies the control mechanism of this device.

In the meantime, because the operations of the device in this embodiment are completely the same as those for the device in the first embodiment except for the relationship between the potential to control the above-mentioned gate electrodes and the anode electrode 8, explanations of the operations are omitted.

Figure 4:
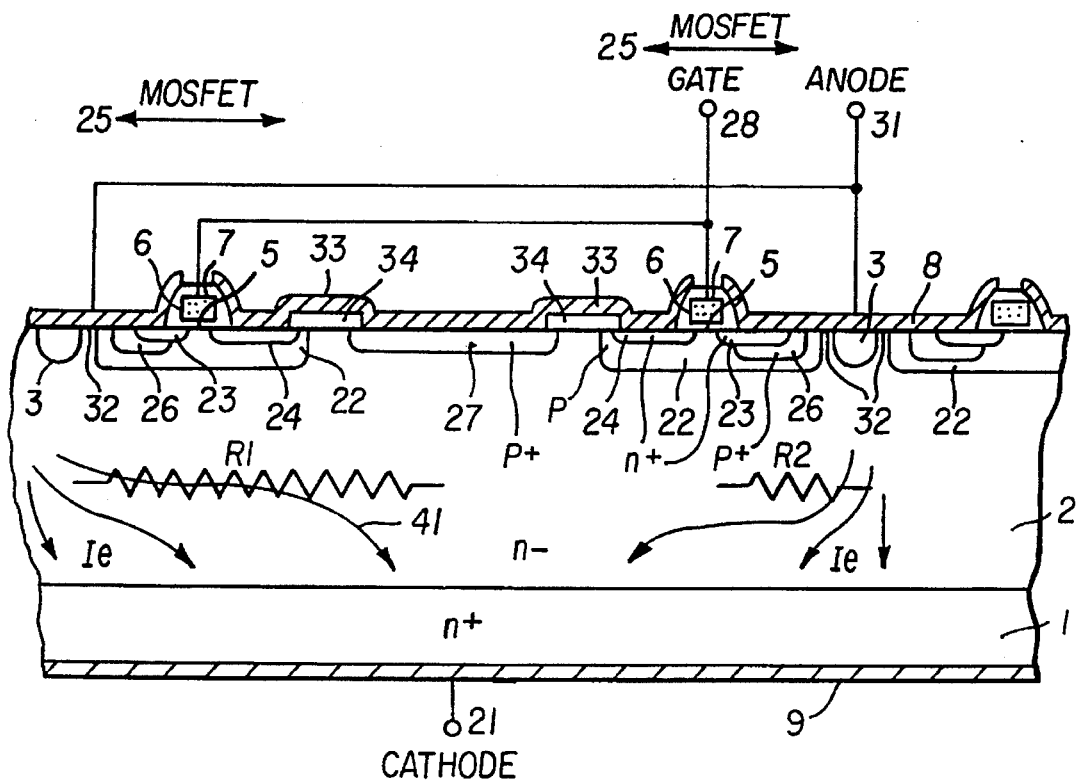
FIG. 4 is a cross section showing a configuration of the semiconductor device according to a third embodiment of the present invention.

FIG. 4 shows a structure of the semiconductor device according to a third embodiment of this invention.

This device has, as in the first embodiment, an n$^-$-type semiconductor layer 2 formed on an n$^+$-type semiconductor substrate 1 and connected with the cathode electrode 9 linked to a cathode terminal 21, on which p$^+$-type anode layers 3 are formed. Furthermore, on either side of these anode layers 3, p-type wells 22 are formed somewhat at a distance from the anode layers 3, while n$^+$-type source layers 23 and drain layers 24 are formed internally to the wells 22. Furthermore, the gate electrodes 6 linked to a gate terminal 28 are disposed over the areas from the source layers 23 to the drain layers 24 via gate oxide films 5, and the MOSFET 25 of a n-channel type is constructed. P$^+$-type contact layers 26 are prepared inside the wells 22, and a p$^+$-type floating layer 27 separated from the wells 22 is formed on the conductivity-modulating layer 2 somewhat at a distance from the wells 22.

The anode electrode 8 linked to an anode terminal 31 is connected to the wells 22 adjoining the anode layers 3, the contact layers 26 and the source layers 23 formed in the wells 22, and is separated from the gate electrodes 6 by the inter-layer insulating films 7. Therefore, the anode electrode 8 is junctioned ohmically with the anode layers 3, and is Schottky-junctioned with the conductivity-modulating layer 2 between the anode layers 3 and the wells 22, thereby forming a Schottky junction region 32. The anode electrode 8 is formed using materials normally used for Schottky diodes including Mo, Ti, and Cr, in order to form the Schottky junction region 32. The anode layers 3, the source layers 23 and the contact layers 26 are formed so as to have sufficiently high impurity concentrations to allow for an ohmic connection with the anode electrode 8. Contact layers 26 are not required if the impurity concentration in the wells 22 is sufficiently high.

The drain layers 24 connected to the source layers 23 using the MOSFET 25 are connected to the floating layer 27 by the connecting electrodes 33. The conductivity-modulating layer 2 are separated from the connecting electrodes 33 by the insulation layers 34 between the drain layers 24 and the floating layer 27.

In such a semiconductor device, when a voltage higher than the gate electrode threshold value is applied to the gate terminal 28, and the MOSFET 25 is conductive, the floating layer 27 is connected to the anode electrode, and has the same potential as the anode electrode.

When a potential positive against the cathode terminal 21 is applied to the anode terminal 31 under this condition, the Schottky junction in the Schottky junction region 32 is forward-biased, and the electron current Ie flows. Noticing on a lateral direction component 41 of this electron current Ie, a voltage drop occurs because of the resistance component R1 in the conductivity-modulating layer 2 reaching from the source layers 3 to the floating layer 27 via the underside of the wells 22 directly below the floating layer 27. When this voltage drop give a sufficient forward bias to the junction between the floating layer 27 and the conductivity modulating layer 2, holes that are the minority carrier against the conductivity modulating layer 2 are injected from the floating layer 27, which is a p$^+$ type layer to the conductivity-modulating layer 2, which is an n$^-$-type layer. Therefore, the conductivity-modulating layer 2 becomes conductivity modulated as in the first embodiment, thereby reducing the on-resistance.

On the other hand, when a reverse voltage, is applied the voltage applied to the gate terminal 28 is maintained below the gate threshold value as in the first embodiment to turn the MOSFET 25 off. This separates the floating layer 27 from the anode electrode 8 and creates a floating condition in the floating layer and stops the hole injection from the anode electrode 8 through the floating layer 27. Furthermore, it is desirable to prevent the injection of holes from P wells for the lateral width of the wells 22 to be narrow, for the resistance component R2 in the conductivity-modulating layer 2 reaching directly below the wells 22 to be decreased, and the voltage drop to be reduced. Small voltage drop in the conductivity-modulating layer 2 directly below the wells 22 due to the electron current Ie and the Schottky barrier voltage can prevent holes from being injected from the wells 22 by decreasing the below the junction voltage across the wells 22 and the conductivity-modulating layer 2. Therefore, hole injection can be controlled by creating a floating condition in the floating layer 27. In which unipolar operation is possible.

If a negative voltage against the cathode terminal 21 is applied to the anode terminal 31 in the semiconductor device under this condition, the anode layers 3 are p-n junctioned and separated. Furthermore, because a depletion layer extends from the wells 22 connected to the anode electrode 8 to the Schottky junction region 32, the current path in the Schottky junction region 32 is pinched off, making it possible to reduce the leakage current and maintain a high withstand voltage.

Since the changes in voltage and current are identical with those in the semiconductor device explained in the first embodiment, no detailed explanation is given. It is of course possible to dope an impurity onto the surface of the wells 22 forming a channel for the MOSFET 25, so that they will become depression-type MOSFET, and adjust the control voltage range in the MOSFET 25. To raise the pinch-off effect when there is a reverse current, it is desirable to reduce the distance between the anode layers 3 and the wells 22, as well as the area per unit in the Schottky junction region. This may be accomplished by increasing the number of anode layers 3.

Figure 5:
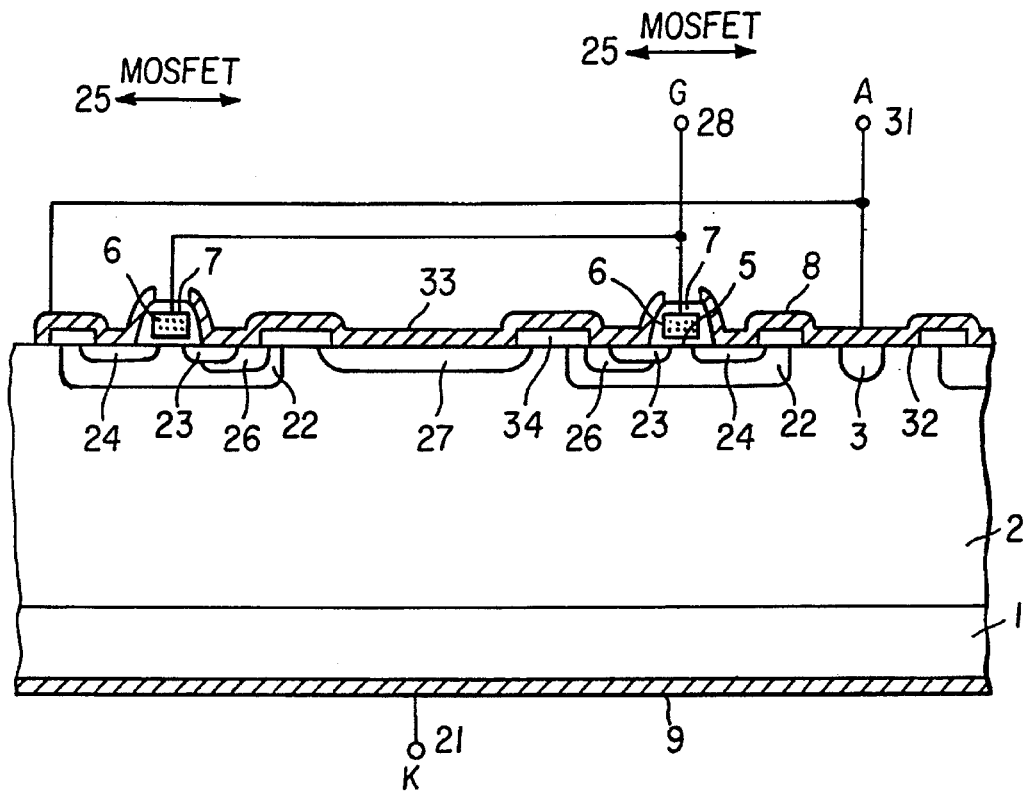
FIG. 5 is a cross section showing a configuration of the semiconductor device according to a fourth embodiment of the present invention.

FIG. 5 shows a construction of the semiconductor device according to a fourth embodiment of this invention. This semiconductor device is a semiconductor to control the floating layer 27 using the MOSFET 25 constructed inside the p-type wells 22, as in the third embodiment, with the same parts given the same numerals. Therefore, explanations thereon are omitted. It should be noted that in a semiconductor device of this embodiment the positions of the source layers 23 are replaced with the drain layers 24 which are constructed on the wells 22, and the connecting electrode 33 from the source layer 23 is connected to the floating layer 27 that is in contact with the contact layer 26.

Therefore, in the semiconductor device of this embodiment, when a forward voltage is applied, holes are injected from the floating layer 27 into the conductivity layer 2 by conducting the MOSFET 25 as in the third embodiment. This makes it possible to realize a low on-resistance. On the other hand, when a reverse voltage is applied, the hole injection can be stopped by turning off the MOSFET 25. Furthermore, in a device of this embodiment, since the potential at the wells 22 is identical to that of the floating layer 27, which floats when the MOSFET 25 is turned off, the specific resistance with the conductivity modulating layer 2 can be raised. For this reason, no hole injection occurs from the wells 22 even if the MOSFET 25 is turned off, thus the length of the wells 22 can be increased, which makes it easier to manufacture.

Since a device of this embodiment raises the possibility that an n-p-n transistor made up of the drain layers 24, the wells 22, and the conductivity-modulating layer 2 may operate when a reverse voltage is applied, it is desirable to make sure that the impurity concentration in the wells 22 has been set sufficiently high.

Figure 6:
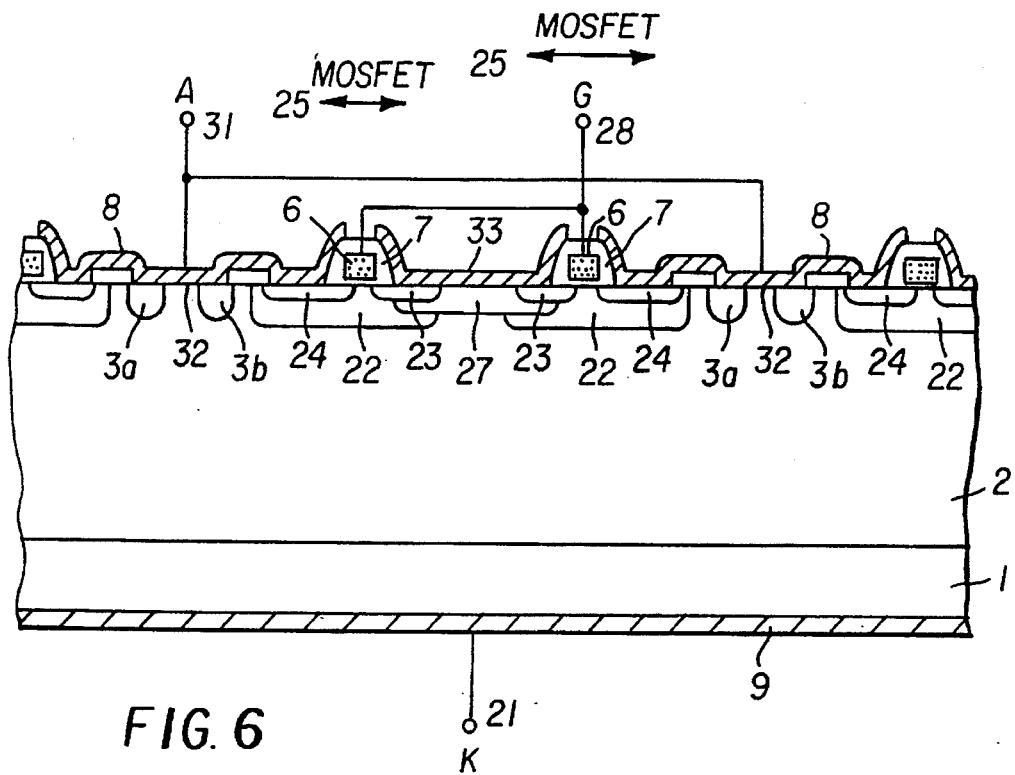
FIG. 6 is a cross section showing a configuration of the semiconductor device according to a fifth embodiment of the present invention.

FIG. 6 shows a construction of the semiconductor device according to a fifth embodiment of this invention. This semiconductor device is a semiconductor to control the floating layer 27 using a MOSFET 25 constructed inside the p-type wells 22, as in the third embodiment, the same parts are given the same numerals. Therefore, the explanations thereon are omitted. The semiconductor device of this embodiment has the positions of the source layers 23 replaced by the drain layers 24, which are constructed on the wells 22. And the connecting electrode 33 from the source layers 23 is connected to the floating layer 27. The floating layer 27 extends to contact the source layer 23, so that the floating layer 27 also functions as the contact layer 26 illustrated in FIG. 5.

It should be noted in a device of this embodiment that the floating layer 27 serves also as the contact layer for the wells 22. Furthermore, two anode layers 3a and 3b are formed on both sides of the Schottky junction regions 32. In a device of this embodiment, the floating layer 27 needs not be formed separate from the wells 22, since the well 22 and the floating layer 27 are combined, the hole injection from the p+ layer, i.e. the floating layer 27 in this embodiment, to the conductivity modulation layer 2 can be controlled by the MOSFET 25. The connecting electrode 33 can be disposed on the surface of the semiconductor device by forming the floating layer 27 in continuity with the wells 22 as in this embodiment. That is, although the insulation layers 34 shown in FIG. 5 are used to separate the conductivity-modulating layer 2 from the connecting electrode 33 in the fourth embodiment, a device of the embodiment shown in FIG. 6 can eliminate the insulation layers 34 because the conductivity-modulating layer 2 will not make contact with the connecting electrode 33.

In a device of this embodiment, the anode layers 3a, 3b are formed on both sides of the Schottky junction region 32. Therefore, as explained in the third embodiment, when a reverse voltage is applied, a depletion layer extends from the anode layers 3a and 3b to the Schottky junction region 32, by which the current path can be pinched off, which means that a leakage current can be prevented.

Figure 7:
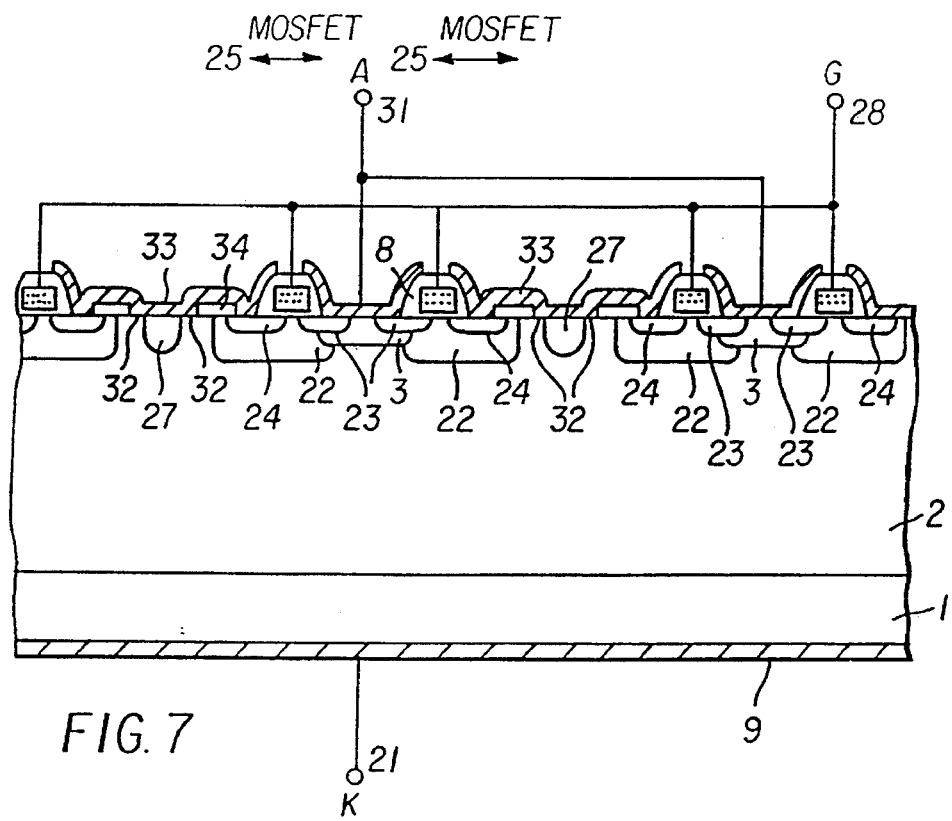
FIG. 7 is a cross section showing a configuration of the semiconductor device according to a sixth embodiment of the present invention.
Figure 8:
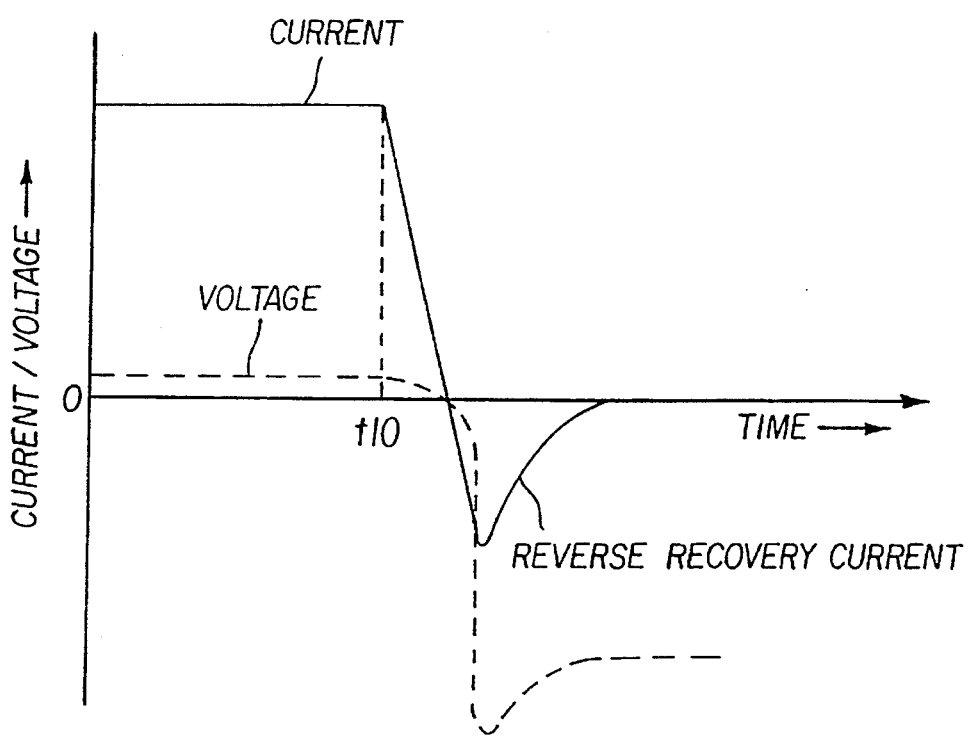
FIG. 8 is a graph showing the current-voltage characteristics of a conventional pin diode.
Figure 9:
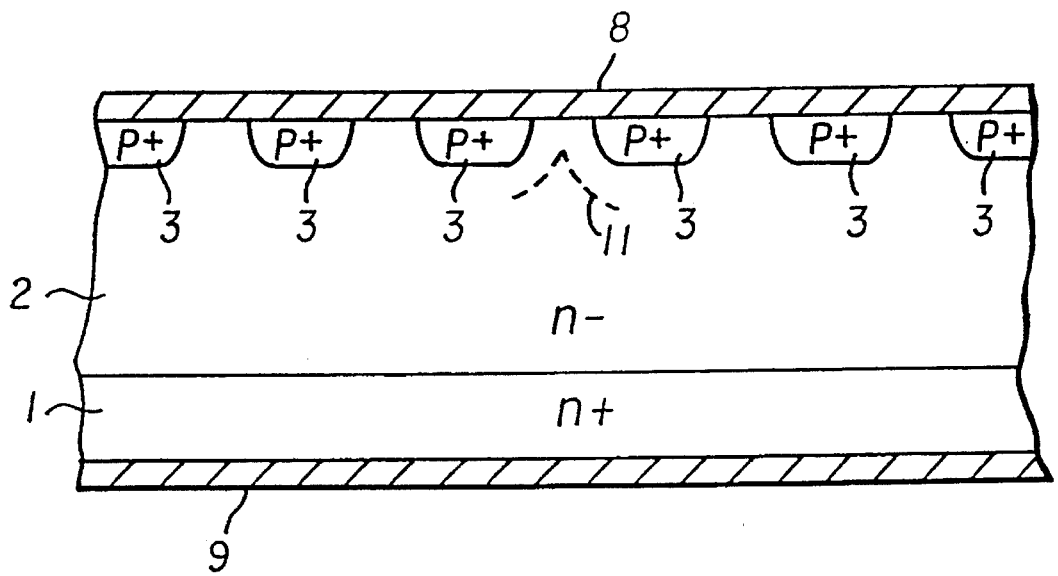
FIG. 9 is a cross section showing a configuration of an improved conventional Schottky-type diode.
Figure 10:
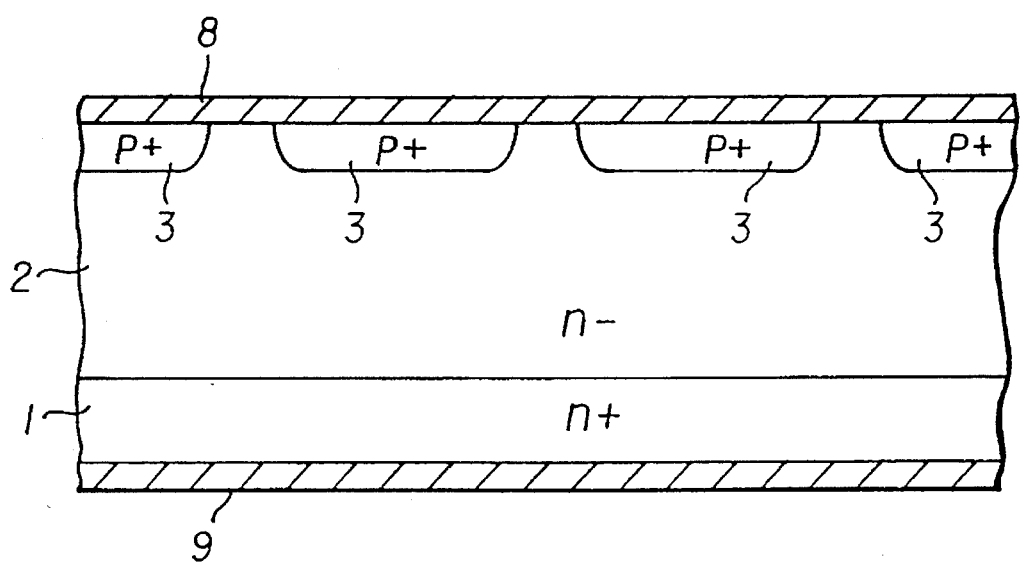
FIG. 10 is a cross section showing a configuration of a conventional spin diode.

FIG. 7 shows the construction of a semiconductor device according to a sixth embodiment of this invention. This semiconductor device is a semiconductor that controls the floating layer 27 using a MOSFET 25 constructed inside the p-type wells 22, as in the third embodiment, with the same parts being given the same numerals, and the explanations thereon omitted. The semiconductor device of this embodiment, differing from that in the third embodiment, has a Schottky junction region formed around the floating layer 27, rather than around the anode layers 3.

In other words, in a device of this embodiment, the anode layers 3 connected to the anode electrode 8 serve also as the contact layer for the wells 22. Furthermore, the anode electrode 8 is connected to the source layers 23, and to the drain layers 24 via the MOSFET 25.

From the drain layers 24, the connecting electrodes 33 are formed on the insulation layers 34, and are also connected to the floating layers 27 in a floating state. Moreover, connecting electrodes 33 are Schottky junctioned with a conductivity-modulating layer 2 around the floating layers 27, so that Schottky junction regions 32 are formed.

Because the anode electrodes 8 can be separated from the Schottky junction regions 32 by the MOSFET 25, a semiconductor device of this construction makes the following control possible. First, when a voltage lower than the gate threshold value is applied to the gate terminal 28 of the MOSFET 25, the anode terminal 31 is separated from the Schottky junction regions 32, and operates as a complete pin diode. Therefore, hole injection occurs from the anode layers 3 and the wells 22, thereby reducing the on-resistance. Secondly, when a voltage higher than the threshold value to the gate terminal 28, hole injection from the anode layers 3 and the wells 22 stops because an electron current flows through the Schottky junction region. Therefore, suppressing the reverse recovery current is possible in a turn-off state, enabling a reduction of switching loss. It is of course desirable to reduce the lateral length of the wells 22 to limit hole injection from the wells 22 and reduce specific resistance in the conductivity-modulating layer 2 to make it sufficiently low given the current density used.

While, in the above embodiments, the explanations have been given for the semiconductor substrates based on a so-called vertical semiconductor device in which the cathode electrode and the anode electrode are formed in a relation of front surface and a rear surface, it, of course, suffices that the semiconductor may be a so-called horizontal semiconductor device with a cathode electrode and anode electrode formed on the same face as the semiconductor substrate.

As described above, in the semiconductor device according to the present invention, it is possible by injecting holes efficiently and introducing a floating region that can be controlled by the MOSFET that the conductivity modulation can be maintained high under a forward voltage, thereby achieving a low on-resistance. Moreover, when a reverse voltage is applied, since it is possible to control the floating region before applying the reverse voltage and stop the hole injection, the number of excessive carriers in the conductivity layer can be reduced, and a reverse recovery current can be suppressed.

As has been described, the semiconductor device according to the present invention has a low on-resistance and a small reverse recovery current. Hence, it can largely reduce switching loss.

Furthermore, since the current is small at a reverse recovery, a voltage jump-up phenomenon caused from -di/dt in the reverse recovery current and the floating inductance can also be reduced. Therefore, it is possible to reduce the number of maloperations and noise generation in other elements due to this jump-up phenomenon, and accordingly realize a semiconductor device that is very reliable.

What is claimed is:

1. A semiconductor device comprising: a conductivity-modulating region of a low concentration second conduction type formed on a cathode region of a high concentration second conduction type; a cathode electrode connected to the cathode region; at least one anode layer of a first conduction type located in the conductivity-modulating region; at least one anode electrode ohmically connected to the anode layer and coupled to the conductivity-modulating region to form a Schottky-junction at a Schottky-junction region of the conductivity-modulating region; and a floating region of the first conduction type coupled to the anode electrode via a MISFET.

2. A semiconductor device as claimed in claim 1, wherein the MISFET is a second conduction-type MISFET that is constructed in a well region of the first conduction type formed in the conductivity-modulating region in the vicinity of the anode region, and wherein the anode electrode is ohmically connected with the well region.

3. A semiconductor device as claimed in claim 1, wherein the MISFET is a second conduction-type MISFET that is constructed in a well region of the first conduction type formed in the conductivity-modulating region, spanning an area of said anode region, and wherein connecting electrodes connected with the floating region are ohmically connected to the well region.

4. A semiconductor device comprising:

a conductivity-modulating region of a low concentration second conduction type formed on a cathode region of a high concentration second conduction type; a cathode electrode connected to the cathode region; at least one anode layer of a first conduction type located in the conductivity-modulating region; at least one anode electrode ohmically connected to the anode layer and coupled to the conductivity-modulating region to form a Schottky-junction at a Schottky-junction region of the conductivity-modulating region; and a floating region of the first conduction type coupled to the anode electrode via a MISFET;

wherein the anode region includes at least two anode layers adjacent to the Schottky-junction region, and the MISFET is a first conduction-type MISFET which controls at least one of said anode layers and the floating region by using gate electrodes formed on gate oxide films located on a surface of the conductivity-modulating region.

5. A semiconductor device comprising:

a conductivity-modulating region of a low concentration second conduction type formed on a cathode region of a high concentration second conduction type; a cathode electrode connected to the cathode region; at least one anode layer of a first conduction type located in the conductivity-modulating region; at least one anode electrode ohmically connected to the anode layer and coupled to the conductivity-modulating region to form a Schottky-junction at a Schottky-junction region of the conductivity-modulating region; and a floating region of the first conduction type coupled to the anode electrode via a MISFET;

wherein the MISFET is a second conduction-type MISFET that is constructed in a well region of the first conduction type formed in the conductivity-modulating region, spanning an area of said anode region, and wherein connecting electrodes connected with the floating region are ohmically connected to the well region; and wherein the anode region includes at least two anode layers adjacent to the Schottky-junction region.

6. A semiconductor device as claimed in claim 3, wherein the floating region and the well region are in contact with each other.

7. A semiconductor device as claimed in claim 5, wherein the floating region and the well region are in contact with each other.

8. A semiconductor device comprising: a conductivity-modulating region of a second conduction type with a low concentration formed on a cathode region of the second conduction type with a high concentration; a cathode electrode connected to the cathode region; an anode region of a first conduction type formed in the conductivity-modulating region; anode electrode connected to the anode region by an ohmic junction; and a floating region of the first conduction type connected to the anode region by a MISFET; wherein the MISFET is a second conduction-type MISFET that is constructed in the well region of the first conduction type formed in the conductivity-modulating region in the vicinity of the anode region; and wherein electrodes connecting the MISFET of the second conduction type with the floating region include a Schottky-junction region that is Schottky-junctioned with the conductivity-modulating region around the floating region.

9. A method for driving a semiconductor device that includes a conductivity-modulating region of a second conduction type with a low concentration electrically opposed to a cathode region of the second conduction type with a high concentration, a cathode electrode connected to the cathode region, at least one anode layer of a first conduction type located in the conductivity-modulating region, at least one anode electrode ohmically connected to the anode layer and coupled to the conductivity-modulating region to form a Schottky-junction at a Schottky-junction region of the conductivity-modulating region, and a floating region of the first conduction type coupled to the anode electrode via a MISFET, said method comprising: the application of a forward voltage to the cathode electrode and anode electrode while applying a conduction voltage to said MISFET, and the application of a an inverse recovery process to apply a reverse voltage to the cathode electrode and anode electrode after applying an interruption voltage to said MISFET.

* * * * *